(12) United States Patent
Lee

(10) Patent No.: US 8,953,410 B2
(45) Date of Patent: Feb. 10, 2015

(54) SEMICONDUCTOR INTEGRATED CIRCUIT CAPABLE OF CONTROLLING READ COMMAND

(75) Inventor: Kyong Ha Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 654 days.

(21) Appl. No.: 13/241,847

(22) Filed: Sep. 23, 2011

(65) Prior Publication Data

US 2012/0008452 A1    Jan. 12, 2012

Related U.S. Application Data

(62) Division of application No. 12/493,755, filed on Jun. 29, 2009, now Pat. No. 8,050,137.

(30) Foreign Application Priority Data

Dec. 22, 2008 (KR) ........................ 10-2008-0130991

(51) Int. Cl.
*G11C 8/00*    (2006.01)
*G11C 7/22*    (2006.01)
*G11C 7/10*    (2006.01)
*G11C 8/04*    (2006.01)
*G11C 8/10*    (2006.01)

(52) U.S. Cl.
CPC .............. *G11C 7/222* (2013.01); *G11C 7/1027* (2013.01); *G11C 7/1072* (2013.01); *G11C 7/1078* (2013.01); *G11C 7/109* (2013.01); *G11C 7/22* (2013.01); *G11C 8/04* (2013.01); *G11C 8/10* (2013.01)
USPC ............ 365/233.19; 365/189.12; 365/230.08; 365/233.1; 365/233.18

(58) Field of Classification Search
USPC ............... 365/233.19, 189.12, 230.08, 233.1, 365/233.18
See application file for complete search history.

(56) References Cited

U.S. PATENT DOCUMENTS 6,522,599 B2 *   2/2003   Ooishi et al. ............. 365/189.15
6,549,452 B1     4/2003   Park
(Continued)

FOREIGN PATENT DOCUMENTS

CN          1697079 A       11/2005
JP       2002-025254 A       1/2002
(Continued)

OTHER PUBLICATIONS

USPTO RR mailed May 10, 2011 in connection with U.S. Appl. No. 12/493,755.
USPTO NOA mailed Jun. 27, 2011 in connection with U.S. Appl. No. 12/493,755.
(Continued)

*Primary Examiner* — Vanthu Nguyen
(74) *Attorney, Agent, or Firm* — Ladas & Parry LLP

(57) ABSTRACT

The semiconductor integrated circuit includes a command decoder, a shift register unit and a command address latch unit. The command decoder is responsive to an external command defining write and read modes and configured to provide a write command or a read command according to the external command using a rising or falling clock. The shift register unit is configured to shift an external address and the write command by a write latency in response to the write command. The column address latch unit is configured to latch and provide the external address as a column address in the read mode, and to latch a write address, which is provided from the shift register unit, and provide the write address as the column address in the write mode.

8 Claims, 9 Drawing Sheets

(56) References Cited

U.S. PATENT DOCUMENTS

| | | |
|---|---|---|
| 7,162,657 B2 | 1/2007 | Takahashi et al. |
| 7,221,618 B2 | 5/2007 | Kim |
| 7,447,108 B2 | 11/2008 | Choi |
| 7,653,780 B2 | 1/2010 | Takahashi |
| 2007/0070730 A1 | 3/2007 | Kim et al. |
| 2008/0002484 A1 | 1/2008 | Cho |
| 2009/0040844 A1 | 2/2009 | Choi |

FOREIGN PATENT DOCUMENTS

| | | |
|---|---|---|
| JP | 2002-245778 A | 8/2002 |
| JP | 2005-129210 A | 5/2005 |
| JP | 2006-190434 A | 7/2006 |
| JP | 2007-095263 A | 4/2007 |
| KR | 100574108 B1 | 4/2006 |
| KR | 1020080002492 A | 1/2008 |

\* cited by examiner

110

_US 8,953,410 B2_

SEMICONDUCTOR INTEGRATED CIRCUIT CAPABLE OF CONTROLLING READ COMMAND

CROSS-REFERENCES TO RELATED APPLICATION

The present application claims priority under 35 U.S.C. 119(a) to Korean application number 10-2008-0130991, filed on Dec. 22, 2008, in the Korean Patent Office, which is incorporated by reference in its entirety as if set forth in full.

BACKGROUND OF THE INVENTION

1. Technical Field

Embodiments described herein relate generally to a semiconductor integrated circuit and, more particularly, to a semiconductor integrated circuit capable of controlling a read command.

2. Background

Typically, a semiconductor integrated circuit operates by synchronizing a command signal and an address with the rising edge of a clock. The trend towards an increase in data bandwidth has a tradeoff in that the number of pins required by the semiconductor integrated circuit is increased. Since a reduced number of pins can be considered beneficial, techniques for achieving such results have been considered.

For example, the use of a multiplexing scheme for the pins has been considered. In this scheme multi-addressing can be performed relative to one address pin using rising and falling edges of a clock. For example, the address pin is used as a first address at the rising edge of the clock, and if the address pin is synchronized with the falling edge of the clock, the address pin can be used as a tenth address. In this way, the requisite number of pins can be partially reduced.

However, a semiconductor integrated circuit typically starts a read or write operation at a subsequent rising edge occurring after multi-addressing is performed twice after an external read or write command is applied to the semiconductor integrated circuit. Thus an address access time (tAA) may be increased in a scheme for reducing the number of requisite pins.

SUMMARY

Embodiments of the present invention include a semiconductor integrated circuit capable of improving an address access time (tAA).

According to one embodiment, a semiconductor integrated circuit includes a command decoder configured to provide a write or read command using a rising or falling clock in response to an external command that defines write and read modes, a shift register unit configured to shift an external address and the write command by a write latency in response to the write command, and a column address latch unit configured to latch the external address as a column address in the read mode, and latch a write address, which is provided from the shift register unit, to provide the write address as the column address in the write mode.

According to another embodiment, a semiconductor integrated circuit, which performs multiplexing using rising and falling clocks through one address pin, includes a command decoder configured to provide a first write command and a read command by synchronizing the first write command and the read command with the rising and falling clocks in response to an external command, a shift register unit configured to shift an external address and the write command by a write latency in response to the write command, thereby providing a write address and a second write command, a burst command controller configured to provide a burst read-write command, which indicates an additional write or read operation, and a burst address, which corresponds to the burst read-write command, in response to the first write command, the read command and a burst length if a predetermined burst length is exceeded, and a column address latch unit configured to latch the external address as a column address in the read mode, provide the write address as the column address by latching the write address in the write mode, and latch the burst address as the column address in response to the burst read-write command.

According to further another embodiment, a semiconductor integrated circuit includes a command decoder configured to provide a write command and a read command, a read/write command controller configured to provide a write-read clock in synchronization with a first edge of a clock in response to the write-read command, and provide the write-read clock in synchronization with a second edge of the clock in response to the read command, and a column address latch unit configured to latch the external address as a column address in response to the read command, and provide the column address by latching the write address, which is provided from a shift register unit, in response to the write-read command.

According to still another embodiment, a semiconductor integrated circuit includes a command decoder configured to provide a read command in synchronization with a first edge of a clock, a read/write command controller configured to provide a read clock in synchronization with a second edge of the clock in response to the read command, and a column address latch unit configured to latch an external address in response to the read command, and provide a column address in synchronization with the second edge of the clock.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
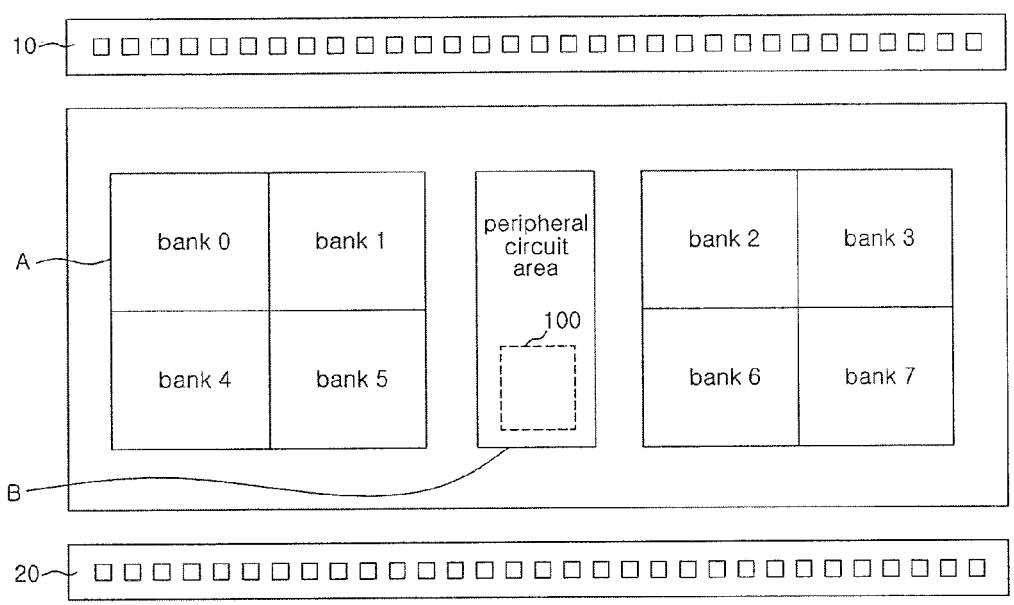
FIG. 1 is a block diagram showing the structure of an exemplary semiconductor integrated circuit in accordance with an embodiment of the present invention.

FIG. 1 is a block diagram showing the structure of an exemplary semiconductor integrated circuit including a command controller in accordance with an embodiment of the present invention.

Referring to FIG. 1, in an embodiment of the present invention the semiconductor integrated circuit includes first and second pad sections 10 and 20 each having a plurality of pads, a memory area 'A' having a plurality of banks, and a peripheral circuit area 'B' formed at a periphery of the memory area 'A'.

External signals are applied to the semiconductor integrated circuit through the pads of the first and second pad sections 10 and 20, and internal signals of the semiconductor integrated circuit are transmitted to the outside through the pads.

The number and arrangement of the banks of the memory area 'A' may vary depending on the configuration and/or degree of integration of the semiconductor integrated circuit.

In an embodiment, the peripheral circuit area 'B' includes the command controller 100. The command controller 100 controls the memory area 'A'. In an embodiment, the command controller 100 provides a write command in synchronization with a rising clock and a read command in synchronization with a falling clock. Hereinafter, the command controller 100 will be described in detail with reference to the accompanying drawings.

Figure 2:
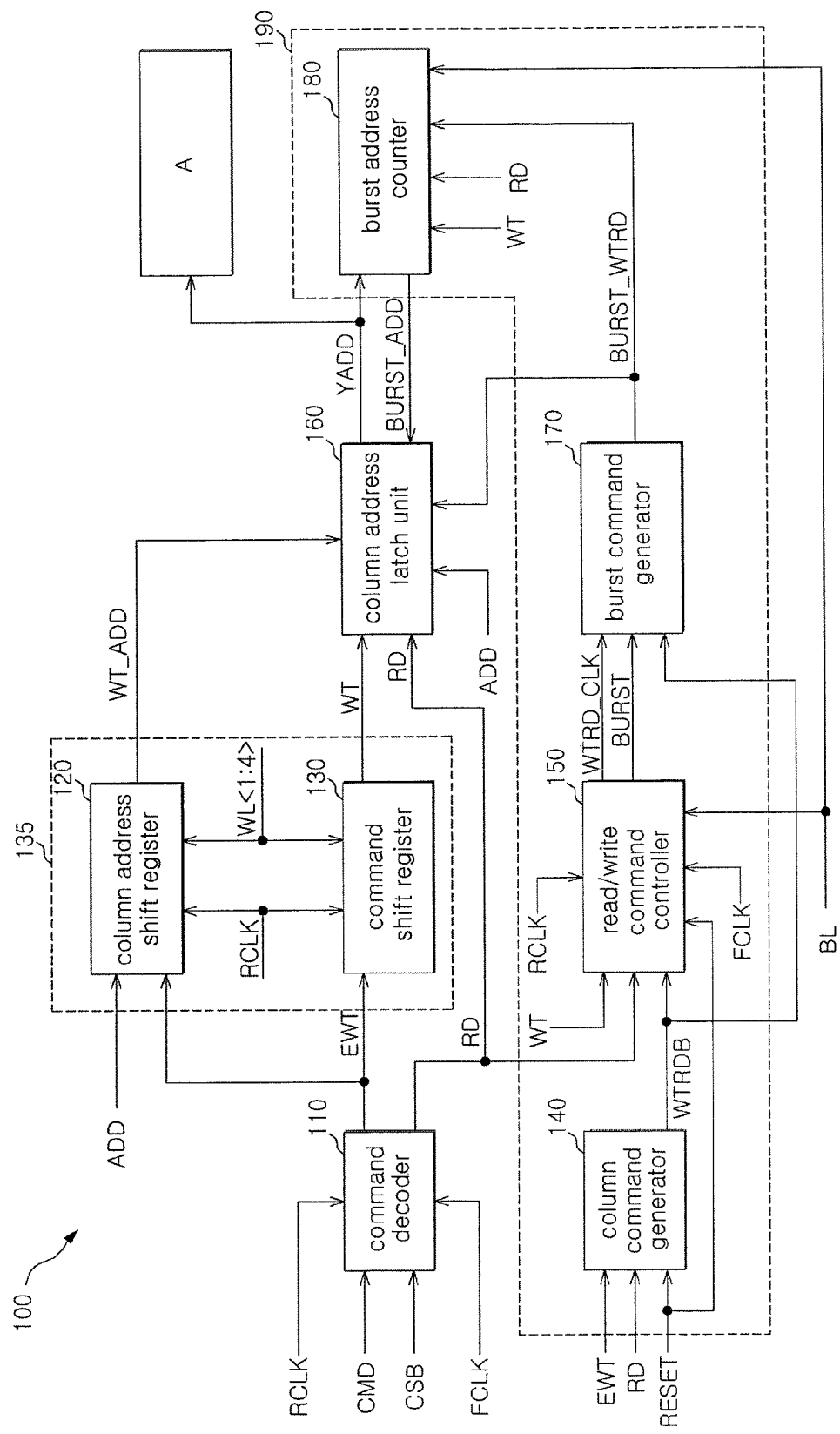
FIG. 2 is a block diagram showing a command controller according to an embodiment of the present invention.

FIG. 2 is a block diagram showing a command controller according to an embodiment of the present invention.

Referring to FIG. 2, in an embodiment the command controller 100 includes a command decoder 110, a shift register unit 135, a column address latch unit 160 and a burst command controller 190.

The command decoder 110 provides a first write command 'EWT' and a read command 'RD', which correspond to a rising clock 'RCLK' or a falling clock 'FCLK', in response to an external command 'CMD' and a chip select signal 'CSB'. For example, if the external command 'CMD' is received and defines a write mode, the command decoder 110 provides the first write command 'EWT' synchronized with the rising clock 'RCLK'. If the external command 'CMD' is received and defines a read mode, the command decoder 110 provides the read command 'RD' synchronized to the falling clock 'FCLK'. Thus, as described above, according to an embodiment of the present invention the read command 'RD' and the first write command 'EWT' can be provided in synchronization with each edge of a clock (the rising and falling edges corresponding to the rising clock and the falling clock) according to the external command 'CMD'. In more detail, the rising clock 'RCLK' denotes a clock generated in synchronization with the rising edge of the clock. Further, the falling clock 'FCLK' denotes a clock generated in synchronization with the falling edge of the clock. Since generating rising and falling clocks from a clock signal is generally known in the art, a detailed description about the generation scheme thereof will be omitted.

In an embodiment, the shift register unit 135 includes a column address shift register 120 and a command shift register 130.

The column address shift register 120 provides a write address 'WT_ADD', which is delayed by a write latency 'WL<1:4>', in response to an external address 'ADD', the first write command 'EWT', the rising clock 'RCLK' and the write latency 'WL<1:4>'.

Further, the command shift register 130 is configured to provide a second write command 'WT', which is delayed by the write latency 'WL<1:4>', in response to the first write command 'EWT', the rising clock 'RCLK' and the write latency 'WL<1:4>'.

Such a write command is a synchronous command which requires time regulation of a clock base.

In other words, the semiconductor integrated circuit starts a write operation with an internal write command, which satisfies a predetermined time requirement necessary for an actual write operation, in response to the first write command 'EWT' which represents the write mode. Thus, the shift register unit 135 synchronizes the external address 'ADD' and the first write command 'EWT' with the rising clock 'RCLK' and delays by the write latency 'WL<1:4>', thereby providing the write command 'WT' and the write address 'WT_ADD' which are necessary for the actual write operation.

In an embodiment, the burst command controller 190 includes a column command generator 140, a read/write command controller 150, a burst command generator 170 and a burst address counter 180.

The column command generator 140 provides a write-read command 'WTRDB' in response to the first write command 'EWT', the read command 'RD' and a reset signal 'RESET'. Thus, it is possible to determine whether the signal corresponds to the read command 'RD' or the first write command 'EWT' based on a level (e.g., a logic level) of the write-read command 'WTRDB'.

The read/write command controller 150 provides a write-read clock 'WTRD_CLK' and a burst signal 'BURST' in response to the second write command 'WT', the read command 'RD', the rising clock 'RCLK', the falling clock 'FCLK', the reset signal 'REST' and burst length 'BL'. The read/write command controller 150 is configured to provide the rising clock 'RCLK' as the write-read clock 'WTRD_CLK' in response to the second write command 'WT', or provide the falling clock 'FCLK' as the write-read clock 'WTRD_CLK' in response to the read command 'RD'. Further, the read/write command controller 150 can be configured to provide the burst signal 'BURST' in response to the burst length 'BL' provided from an MRS (mode register set). For example, the burst length 'BL' may be set as 4, 8 or 16. For the purpose of illustration, the burst length 'BL' is set to 4.

In an embodiment, the burst command generator 170 provides a burst read-write command 'BURST_WTRD' in response to the write-read command 'WTRDB', the write-read clock 'WTRD_CLK' and the burst signal 'BURST'. That is, either a read mode or a write mode is performed, and the selection of read mode/write mode is based on the level (e.g., voltage level) of the write-read command 'WTRDB'. When the base burst length 'BL' is set to 4, as described above, the burst signal 'BURST' is generated once. If the burst length 'BL' is 8, the burst signal 'BURST' is generated twice. If the burst length 'BL' is 16, the burst signal 'BURST' is generated four times. Thus, if the burst length 'BL' is 16, the read command 'RD' (or the write command 'WT') must be provided once, and an additional read command must be provided three times. In this regard, a command including additional read information corresponds to the burst read-write command 'BURST_WTRD'. The relationship between the second write command 'WT' and the burst read-write command 'BURST_WTRD' can be explained in the same manner as described above. However, it should be understood that the above description is for explaining, but not limited to, a read or write operation when the burst length 'BL' is set to 4.

In an embodiment, the burst address counter 180 is configured to provide a burst address 'BURST_ADD' in response to the read command 'RD', the second write command 'WT', the burst read-write command 'BURST_WTRD', the burst length 'BL' and a column address 'YADD'. In detail, when providing the burst address 'BURST_ADD' in response to the burst read-write command 'BURST_WTRD', the burst address counter 180 counts from (and increments) the column address 'YADD', which is latched in response to the read command 'RD' or the second write command 'WT', to the burst length 'BL' and then provides the burst address 'BURST_ADD'.

In an embodiment, the column address latch unit 160 is configured to provide the column address 'YADD' in response to the second write command 'WT', the read command 'RD', the burst read-write command 'BURST_WTRD', the write address 'WT_ADD', the external address 'ADD' and the burst address 'BURST_ADD'. In detail, the column address latch unit 160 provides the write address 'WT_ADD' to the memory area 'A' as the column address 'YADD' in response to the second write command 'WT', provides the external address 'ADD' to the memory area 'A' as the column address 'YADD' in response to the read command 'RD', and provide the burst address 'BURST_ADD' to the memory area 'A' as the column address 'YADD' in response to the burst read-write command 'BURST_WTRD'. According to one embodiment, in the case of the read command 'RD', the column address 'YADD' is provided in synchronization with the falling clock 'FCLK'. Further, a read-related operation of the burst read-write command 'BURST_WTRD' can also be provided in synchronization with the falling clock 'FCLK'.

Figure 3:
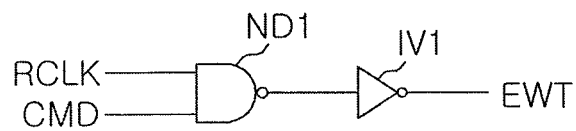
FIG. 3 is a circuit diagram showing the command decoder of the semiconductor integrated circuit shown in FIG. 1 according to an embodiment of the present invention.
Figure 3:
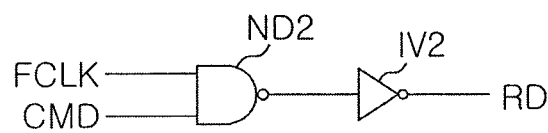

FIG. 3 is a circuit diagram showing the command decoder of the command controller exemplified in FIG. 1 according to an embodiment of the present invention.

Referring to FIG. 3, the command decoder 110 according to an embodiment includes first and second NAND gates ND1 and ND2, and first and second inverters IV1 and IV2.

The first NAND gate ND1 is connected in series to the first inverter IV1, and performs a NAND logical operation on the rising clock 'RCLK' and the external command 'CMD'.

The second NAND gate ND2 is connected in series to the second inverter IV2, and performs a NAND logical operation on the falling clock 'FCLK' and the external command 'CMD'.

If the external command 'CMD' is a write mode command, the command decoder 110 provides the first write command 'EWT' synchronized with the rising clock 'RCLK'. If the external command 'CMD' is a read mode command, the command decoder 110 provides the read command 'RD' synchronized with the falling clock 'FCLK'. In an embodiment, the command decoder 110 can divide edges of the synchronization clock into falling and rising edges according to the read command 'RD' and the first write command 'EWT'.

Figure 4:
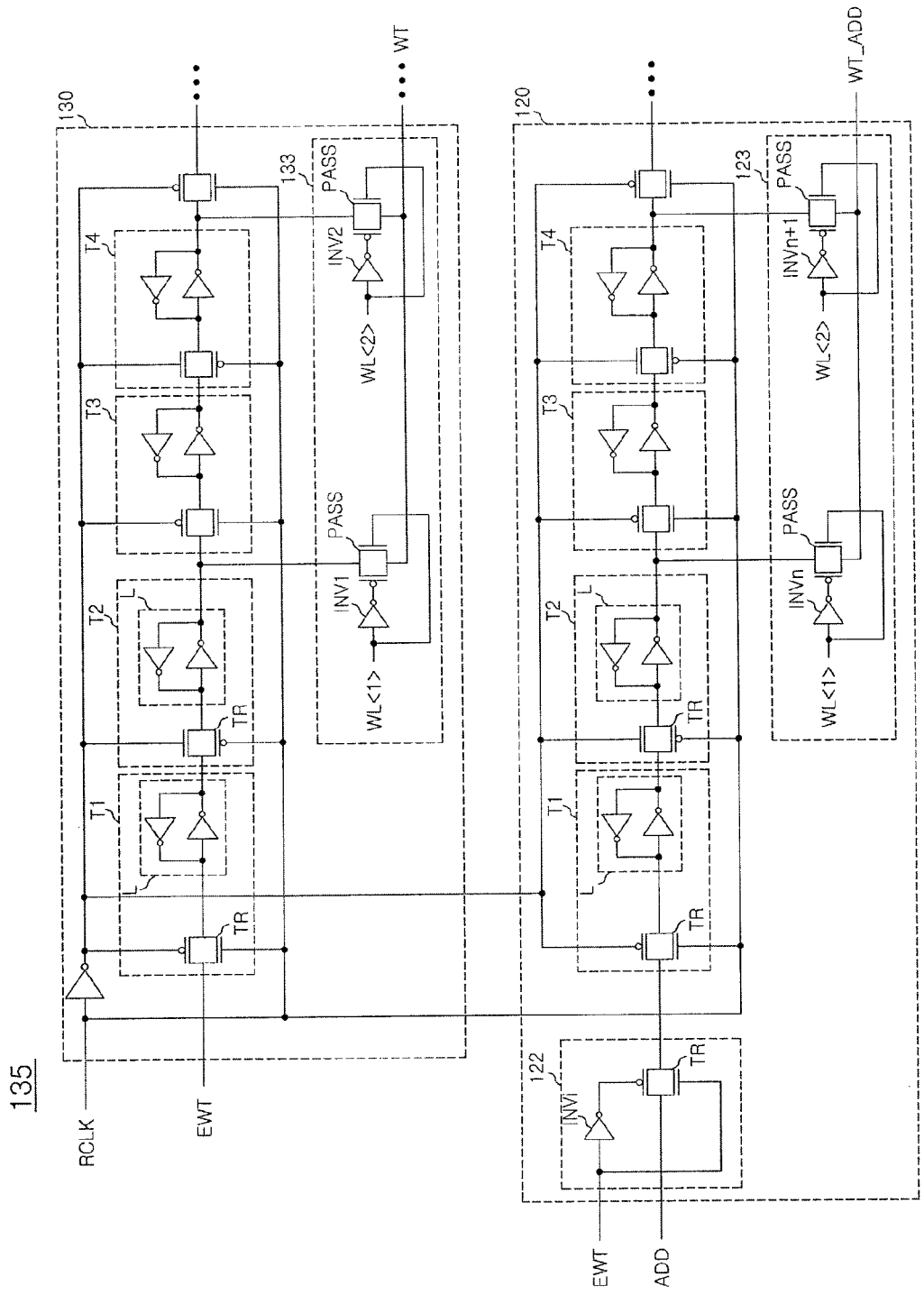
FIG. 4 is a circuit diagram showing the shift register unit of the command controller shown in FIG. 2 according to an embodiment of the present invention.

FIG. 4 is a circuit diagram showing the shift register unit of the command controller illustrated in FIG. 2 according to an embodiment of the present invention.

Referring to FIG. 4, the command shift register 130 of the shift register unit 135 includes a plurality of transmitters (for the purpose of illustration, first to fourth transmitters T1 to T4), and a first latency activation unit 133.

In an embodiment, each of the first to fourth transmitters T1 to T4 includes a transfer gate TR and a latch unit L.

The first transmitter T1 transmits the first write command 'EWT' in synchronization with a rising edge of the rising clock 'RCLK'. The transfer gate TR is turned on when the level of the rising clock 'RCLK' is a high level. The latch unit L latches the signal output by the transfer gate TR.

The second transmitter T2 is configured to transmit the signal from the first transmitter T1 in synchronization with a falling edge of the rising clock 'RCLK'. As shown in FIG. 4, the configuration of the transfer gate TR is such that the transfer gate is turned on when the rising clock 'RCLK' is a low level. The latch unit L latches the signal output by the transfer gate TR. The third and fourth transmitters T3 and T4 operate in a manner similar to that of the first and second transmitters T1 and T2.

Accordingly, the first to fourth transmitters T1 to T4 are alternately turned on/off in response to the rising clock 'RCLK'. Thus, a signal transmission time after turn-on of the first and third transmitters T1 and T3 or the second and fourth transmitters T2 and T4 is delayed by one clock period corresponding to each pair of a turned-on and turned-off transmitter of the transmitters T1 to T4.

In an embodiment, the first latency activation unit 133 is configured to provide output signals of the first to fourth transmitters T1 to T4 as the second write command 'WT' in response to the write latency 'WL<1:4>' of the semiconductor integrated circuit. The first latency activation unit 133 includes pass gates PASS and inverters INV1 and INV2, which receive the write latency 'WL<1:4>', respectively.

The operation of the first latency activation unit 133 will now be described. If the write latency 'WL<1:4>' is 1, the first write latency 'WL<1>' is at an activated level, for example, in FIG. 4 the activated level is a high level. Thus, the pass gate PASS, which receives the first activated write latency 'WL<1>', is turned on, so that the output signal of the second transmitter T2 can be provided as the second write command 'WT'. That is, time transmission time is delayed by one clock period through the first and second transmitters T1 and T2 or the third and fourth transmitters T3 and T4, and therefore when the configuration of FIG. 4 is used an address signal delayed by one clock period can be provided when the write latency 'WL<1:4>' is 1.

In an embodiment, the column address shift register 120 includes first to fourth transmitters T1 to T4, a write command receiver 122 and a second latency activation unit 123.

Since the configuration and operation principle of the column address shift register 120 is substantially identical to that of the command shift register 130, a detailed description thereof will be omitted in order to avoid redundancy. Briefly, the column address shift register 120 receives the external address 'ADD' in order to provide the write address 'WT_ADD' by delaying the external address 'ADD' by the write latency 'WL<1:4>'. In order to operate in response to the first write command 'EWT', the column address shift register 120 further includes the write command receiver 122.

In an embodiment, the write command receiver 122 includes an inverter INVi and a transfer gate TR to transmit the external address 'ADD' in response to an activated level of the first write command 'EWT'.

Figure 5:
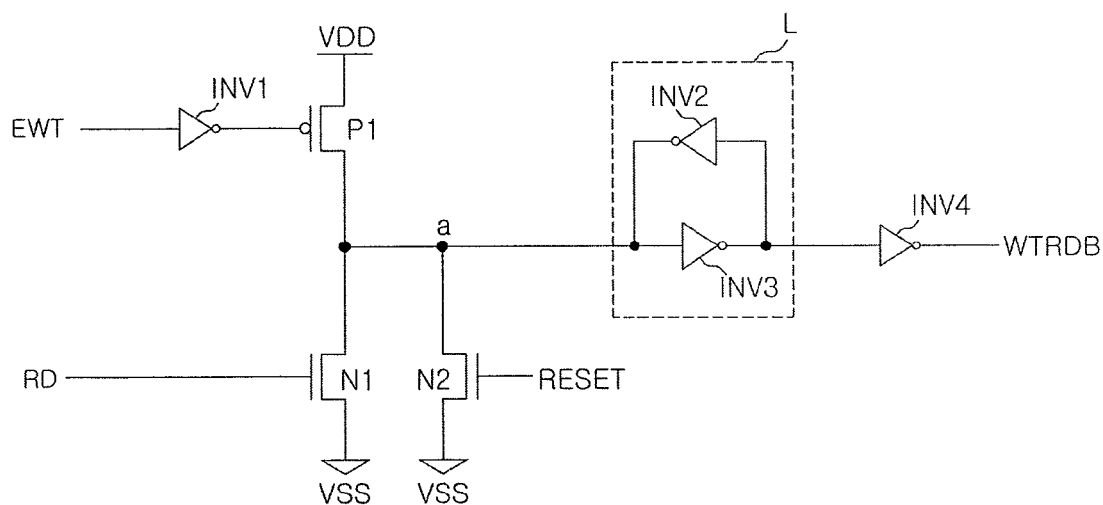
FIG. 5 is a circuit diagram showing the column command generator of the command controller shown in FIG. 2 according to an embodiment of the present invention.

FIG. 5 is a circuit diagram showing the column command generator of the command controller illustrated in FIG. 2 according to an embodiment of the present invention.

Referring to FIG. 5, in an embodiment the column command generator 140 includes a first PMOS transistor P1, first and second NMOS transistors N1 and N2, and a latch unit L.

The first PMOS transistor P1 includes a gate terminal, which receives an inverted first write command 'EWT' (obtained by passing the first write command 'EWT' through a first inverter INV1); a source terminal, which receives a supply voltage 'VDD'; and a drain terminal connected to node 'a'.

In an embodiment, the first NMOS transistor N1 includes a gate terminal, which receives the read command 'RD'; a source terminal connected to a ground voltage 'VSS'; and a drain terminal connected to node 'a'.

In an embodiment, the second NMOS transistor N2 includes a gate terminal, which receives the reset signal 'RESET'; a source terminal connected to the ground voltage 'VSS'; and a drain terminal connected to node 'a'. The activated reset signal 'RESET' is applied to the gate terminal of the second NMOS transistor N2 in order that node 'a' can be initialized.

In an embodiment, the latch unit L includes second and third inverters INV2 and INV3 which are connected to each other in a latch type configuration.

When the first write command 'EWT' is activated (i.e., enabled) so as to be a high level and applied to the column command generator 140, the first PMOS transistor P1 is turned on since the high level signal is inverted by the first inverter INV1 and applied to the gate terminal of the first PMOS transistor, and node 'a' is therefore at a high level. In this case, the signal of node 'a' is latched by the latch unit L and provided to a fourth inverter INV4, and therefore a high level write-read command is output by the column command generator.

When the read command 'RD' is activated (i.e. enabled) so as to be a high level and applied to the column command generator 140, the first NMOS transistor N1 is turned on since the high level signal is applied to the gate terminal of the NMOS transistor N1, and node 'a' is therefore at a low level. In this case, the signal of node 'a' is latched by the latch unit L and provided to the fourth inverter INV4, and therefore a low level write-read command is output by the column command generator.

Accordingly, in the just described embodiment in which the respective first write command and read command are activated at a high level, the high level of the write-read command 'WTRDB' represents activation of the first write command 'EWT', and the low level of the write-read command 'WTRDB' represents activation of the read command 'RD'. Thus, the write mode can be distinguished from the read mode based on the level of the write-read command 'WTRDB'.

Figure 6:
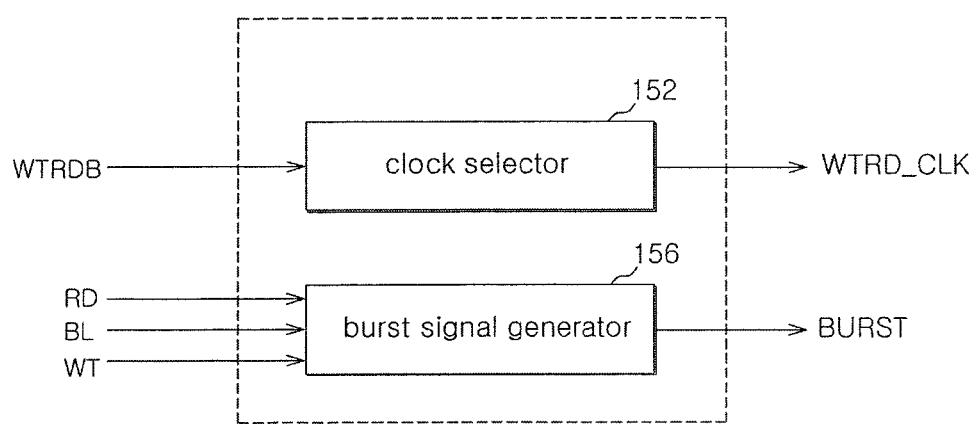
FIG. 6 is a block diagram showing a read/write command control unit of the command controller shown in FIG. 2 according to an embodiment of the present invention.
Figure 7:
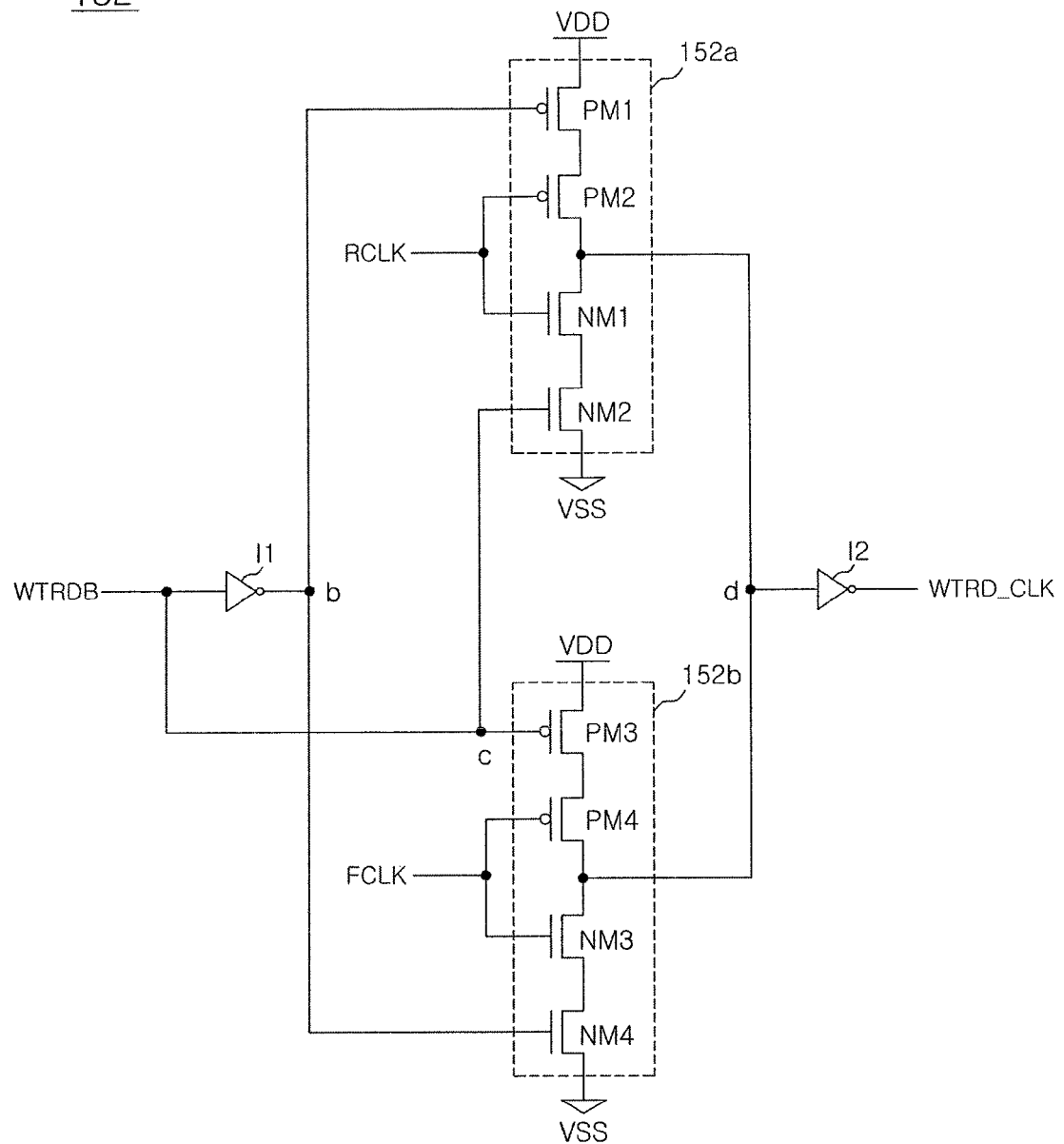
FIG. 7 is a circuit diagram showing the clock selector of the read/write command control unit shown in FIG. 6 according to an embodiment of the present invention.
Figure 8:
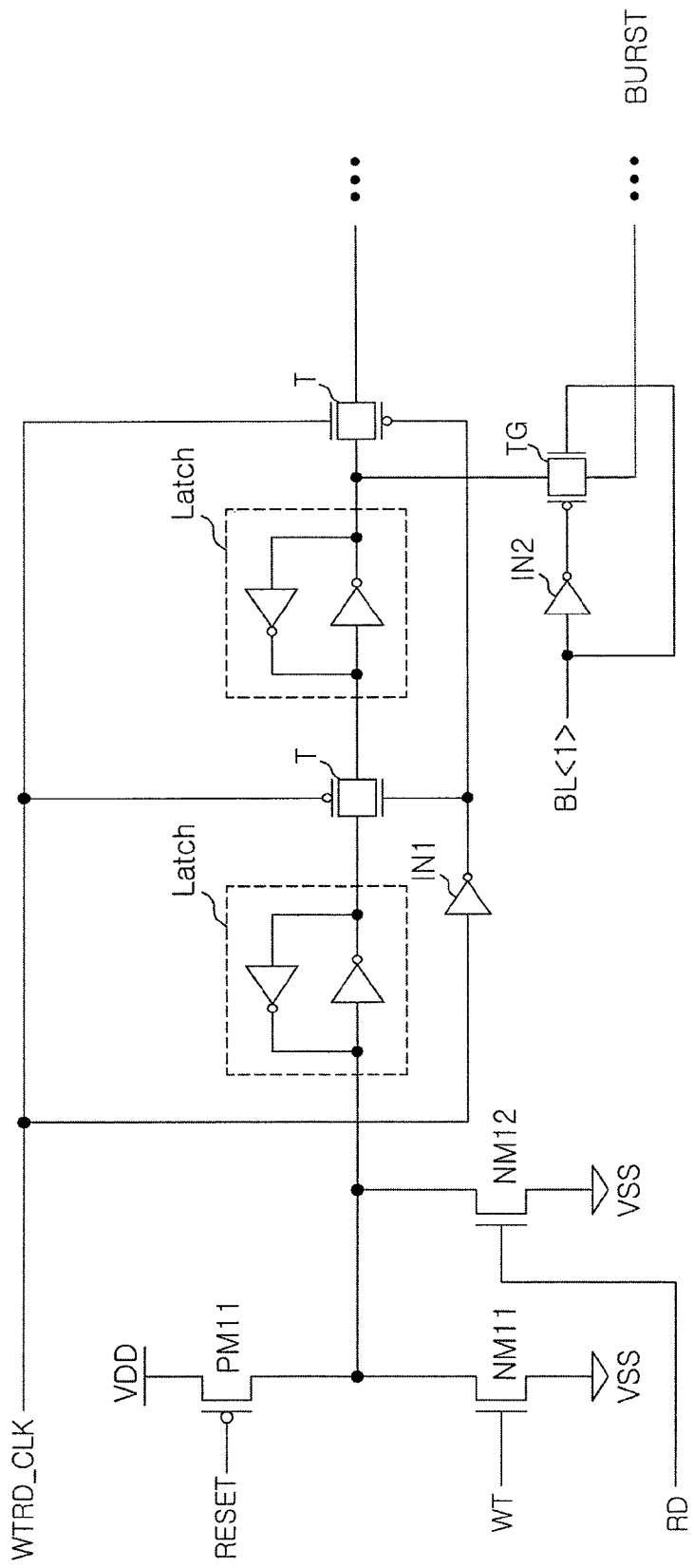
FIG. 8 is a circuit diagram showing the burst signal generator of the read/write command control unit shown in FIG. 6 according to an embodiment of the present invention.

FIG. 6 is a block diagram schematically showing the read/write command control unit of the command controller illustrated in FIG. 2 according to an embodiment of the present invention, and FIGS. 7 and 8 are detailed circuit diagrams showing the read/write command control unit of FIG. 6 according to an embodiment of the present invention.

Referring to FIGS. 6 to 8, in an embodiment the read/write command controller 150 includes a clock selector 152 and a burst signal generator 156.

The clock selector 152 selects either the rising clock 'RCLK' or the falling clock 'FCLK' in response to the write-read command 'WTRDB' in order to provide the write-read clock.

Referring to FIG. 7, in an embodiment the clock selector 152 includes a rising clock selection unit 152a and a falling clock selection unit 152b.

In an embodiment, the rising clock selection unit 152a includes first and second PMOS transistors P1 and P2 and first and second NMOS transistors N1 and N2, which are connected in series. The rising clock selection unit 152a is a clocked-inverter, which is responsive to the write-read command 'WTRDB', and provides the rising clock 'RCLK' to node 'd' when the write-read command 'WTRDB' is at the high level (i.e., high logic level).

In an embodiment, the falling clock selection unit 152b includes third and fourth PMOS transistors P3 and P4 and third and fourth NMOS transistors N3 and N4, which are connected in series. The falling clock selection unit 152b is a clocked-inverter, which is also responsive to the write-read command 'WTRDB'. The falling clock selection unit 152b provides the falling clock 'FCLK' to node 'd' when the write-read command 'WTRDB' is at the low level (i.e., low logic level).

In detail, in the case in which the device is in the write mode, the clock selector 152 provides the rising clock 'RCLK' as the write-read clock 'WTRD_CLK' as the level of the write-read command 'WTRDB' represents the activation of the first write command 'EWT'. In the case in which the device is in the read mode, the clock selector 152 provides the falling clock 'FCLK' as the write-read clock 'WTRD_CLK' as the level of the write-read command 'WTRDB' represents activation of the read command. Accordingly, in the just described embodiment, each edge (i.e., rising and falling edge) of the clock can be used to represent the write command or the read command (i.e., the write and read commands can be provided in synchronization with rising and falling edges of the clock), and the edges of the clock can be used for actual write and read operations.

Referring to FIG. 8, in an embodiment, the burst signal generator 156 includes a first PMOS transistor P11, first and second NMOS transistors N11 and N12, a plurality of latch units and transfer gates T each corresponding to a latch unit.

The operation principle of the burst signal generator 156 is similar to that of the column address shift register 120 described above with reference to FIG. 4; therefore, the burst signal generator 156 will be described briefly.

When the second write command 'WT' is activated, the burst signal generator 156 generates the burst signal 'BURST' activated and delayed by the burst length 'BL'. Further, when the read command 'RD' is activated, the burst signal generator 156 generates the burst signal 'BURST' activated and delayed by the burst length 'BL'. The burst signal generator 156 can be initialized by the reset signal 'RESET'.

Further, the burst signal generator 156 generates the burst signal 'BURST' delayed by the burst length 'BL' in synchronization with the write-read clock 'WTRD_CLK' in response to the second activated write command 'WT'. Similar to this, the burst signal generator 156 generates the burst signal 'BURST' delayed by the burst length 'BL' in synchronization with the write-read clock 'WTRD_CLK' in response to the activated read command 'RD'. As described above, when the second write command 'WT' is activated, the write-read clock 'WTRD_CLK' corresponds to the rising clock 'RCLK'. Further, when the read command 'RD' is activated, the write-read clock 'WTRD_CLK' corresponds to the falling clock 'FCLK'. In the semiconductor integrated circuit according to an embodiment, the burst length 'BL' is set to 4 as an initial value. However, as described above, the burst length 'BL' is not limited to this initial value.

In such a case, the burst signal generator 156 can further include a divide-by-4 circuit.

For example, if the burst length 'BL' is 4, the burst signal 'BURST', which is divided by 4 clock periods, is activated by the burst signal generator 156 in response to the second write command 'WT' or the read command 'RD'. If the burst length 'BL' is 8, a counter pulse can be generated twice by the divide-by-4 circuit so that the burst signal 'BURST' activated after being delayed by the 4 clock periods can be activated twice. As described above, when the burst length 'BL' exceeds 4, an internal read-write command signal is required to additionally provide the read or write command.

Although not shown in the drawings, similar to the command decoder 110 shown in FIG. 3, in an embodiment the burst command generator 170 provides the burst read-write command 'BURST_WTRD' by a NAND logical operation performed on the burst signal 'BURST', the write-read clock 'WTRD_CLK' and the write-read command 'WTRDB'. Thus, the burst command generator 170 provides an additional write or read command synchronized with the write-read clock 'WTRD_CLK' whenever the burst signal 'BURST' is activated.

Further, when an additional internal command is required according to the write-read command 'WTRDB' and the burst length 'BL', the burst address counter ('180' in FIG. 2) can count the column address 'YADD' latched in response to the second write command 'WT' or the read command 'RD' while increasing the column address 'YADD', thereby providing the burst address 'BURST_ADD'. In detail, if the burst length 'BL' exceeds 4, the burst address counter 180 receives the column address 'YADD' latched in response to the second write command 'WT' or the read command 'RD', and counts the column address 'YADD' while increasing the column address 'YADD'. At this time, an address increment mode may include an interleaving mode or a sequential mode according to the configuration or characteristics of the circuit.

According to an embodiment, the burst read-write command 'BURST_WTRD' is provided in synchronization with either the rising or falling edge of the clock according to which of the read or write modes the device is in. However, the scope of the disclosure is not limited thereto. That is, the burst read-write command 'BURST_WTRD' or burst address 'BURST_ADD' scheme may be omitted according to the configuration or characteristics of the semiconductor integrated circuit.

Figure 9:
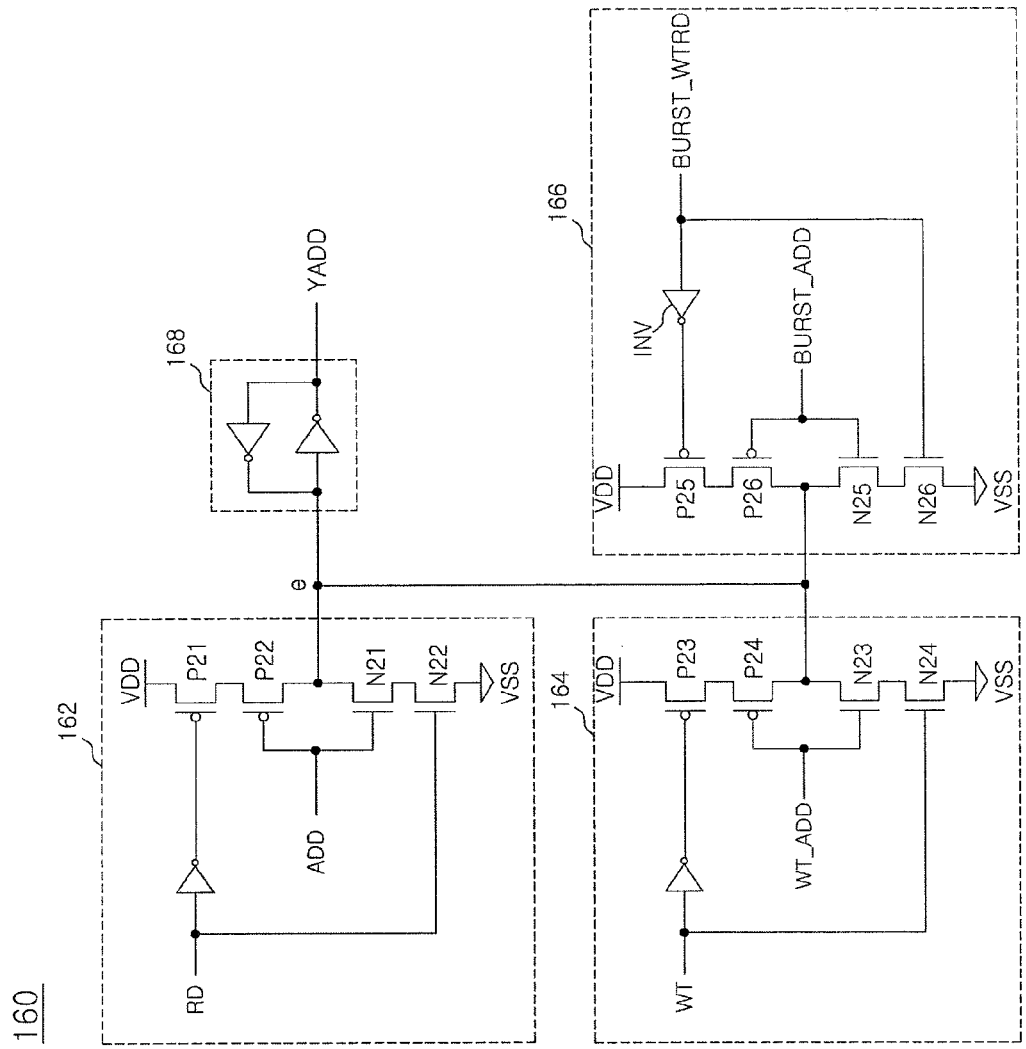
FIG. 9 is a circuit diagram showing the column address latch unit of the command controller shown in FIG. 2 according to an embodiment of the present invention.

FIG. 9 is a circuit diagram showing the column address latch unit of the command controller illustrated in FIG. 2 according to an embodiment of the present invention.

Referring to FIG. 9, in an embodiment, the column address latch unit 160 includes first to third address latch units 162, 164 and 166, and a latch section 168.

In an embodiment, the first address latch unit 162 provides the external address 'ADD' as the column address 'YADD' in response to the read command 'RD'.

The first address latch unit 162 shown in FIG. 9 is a clocked-inverter that is responsive to the read command 'RD' and includes first and second PMOS transistors P21 and P22 and first and second NMOS transistors N21 and N22, which are connected in series.

The second address latch unit 164 shown in FIG. 9 provides the write address 'WT_ADD' as the column address 'YADD' in response to the second write command 'WT'.

The second address latch unit 164 is a clocked-inverter that is responsive to the second write command 'WT' and includes third and fourth PMOS transistors P23 and P24 and third and fourth NMOS transistors N23 and N24, which are connected in series.

The third address latch unit 166 shown in FIG. 9 provides the burst address 'BURST_ADD' as the column address 'YADD' in response to the burst read-write command 'BURST_WTRD'.

The third address latch unit 166 is a clocked-inverter that is responsive to the burst read-write command 'BURST_WTRD' and includes fifth and sixth PMOS transistors P25 and P26 and fifth and sixth NMOS transistors N25 and N26, which are connected in series.

In an embodiment, the first to third address latch units 160 share an output node e connected to the input of the latch section 168. The latch section 168 is configured to provide the column address 'YADD' by inverting and latching the signal of node 'e'.

The operation of the column address latch unit 160 will now be described. When the read command 'RD' is activated, the first PMOS transistor P21 and the second NMOS transistor N22 are turned on, so the address 'ADD' is provided to node 'e'. When the second write command 'WT' is activated, the third PMOS transistor P23 and the fourth NMOS transistor N24 are turned on, so the write address 'WT_ADD' is provided to node 'e'. Similarly, when the burst read-write command 'BURST_WTRD' is activated, the fifth PMOS transistor P25 and the sixth NMOS transistor N26 are turned on, so the burst address 'BURST_ADD' is provided to node 'e'.

As described above, according to the commands, the column address latch unit 160 can selectively provide an address to which delay is applied; an external address; and an address that is further counted in addition to the basic burst length 'BL'.

Figure 10:
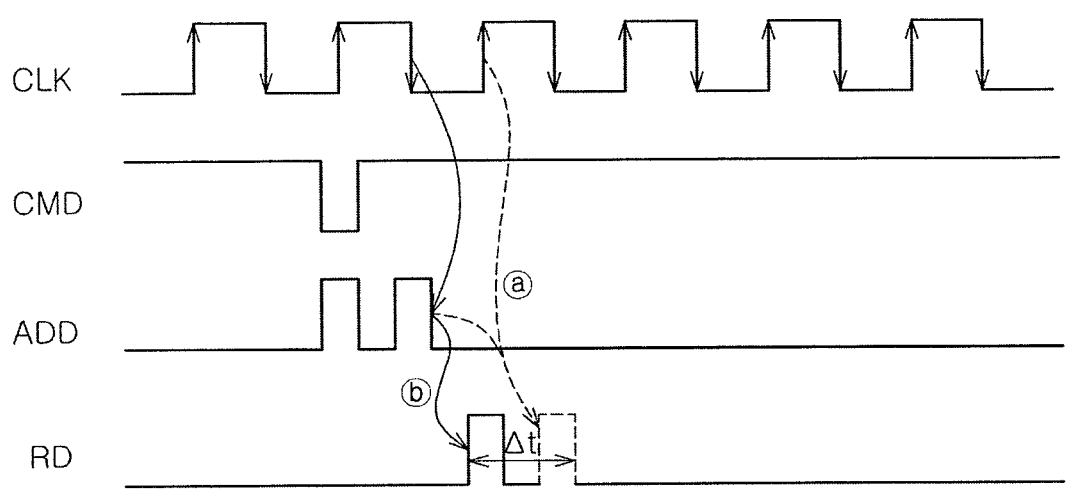
FIG. 10 is a timing chart shown for illustrating the relationship between the clock and the commands of the semiconductor integrated circuit shown in FIG. 1 according to an embodiment of the present invention.

FIG. 10 is a timing chart shown for illustrating the operation of the semiconductor integrated circuit shown in FIG. 1.

Referring to FIG. 10, the external command 'CMD' is provided in synchronization with the rising edge of a clock 'CLK'. Further, the external address 'ADD' is provided and is addressed to the rising and falling edges of the clock 'CLK', with which the external command 'CMD' is synchronized.

According to the related art, the read command 'RD' is provided in synchronization with the rising edge of the clock 'CLK' after the addressing has been performed relative to the address 'ADD' addressed to the falling edge of the clock 'CLK' (see, dotted lines ⓐ).

However, according to an embodiment of the present invention, when the address 'ADD' is addressed to the falling edge of the clock 'CLK', the read command 'RD' can operate in synchronization with the falling edge of the clock 'CLK' (see, solid lines ⓑ). Thus, the tAA can be earlier by a predetermined time Δt, e.g. about ½tCK.

That is, when addressing is performed using the rising and falling edges, the write command is a synchronous command which must follow predefined timing regulations such as write latency. However, in the read mode, a non-synchronous command path exists until a predetermined cell is accessed after the read command is activated. Thus, the read command 'RD' is provided in synchronization with the falling clock 'FCLK', at which the address is received, (other than the rising clock 'RCLK') such that the tAA is earlier by the ½tCK, whereby the tAA provided to the memory area 'A' (see, FIG. 1) can be improved.

Accordingly, in the embodiments of the present invention described above, the read command can be provided using the failing edge of the clock, or the falling clock, so that the speed of the read operation can be improved.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A semiconductor integrated circuit comprising:
   a command decoder configured to provide a write command and to provide a read command;
   a read/write command controller configured to provide a write-read clock in synchronization with a first edge of a clock when the write command is activated, and provide the write-read clock in synchronization with a second edge of the clock when the read command is activated; and
   a column address latch unit configured to latch a column address in response to a burst write-read command generated from the write-read clock and a burst signal.

2. The semiconductor integrated circuit of claim 1, wherein the read/write command controller comprises a burst signal generator which is configured to provide the burst signal in response to a burst length provided from an MRS (mode register set).

3. The semiconductor integrated circuit of claim 1, further comprising a shift register unit, the shift register unit comprising:
   a command shift register configured to shift the write command by the write latency by synchronizing the write command with the rising clock when the write command is activated in order to output a second write command; and
   a column address shift register configured to shift an external address by the write latency by synchronizing the external address with the rising clock in response to the write command in order to output a write address,
   wherein the column address latch unit is further configured to latch and provide the external address as a column address in response to the read command, and latch and provide the write address provided from the shift register unit as the column address in response to the second write command.

4. The semiconductor integrated circuit of claim 1, further comprising a burst command generator configured to provide the burst write read command synchronized with the write-read clock.

5. The semiconductor integrated circuit of claim 4, wherein the burst command generator is configured to generate the burst write-read command in response to the burst signal.

6. The semiconductor integrated circuit of claim 2, wherein the clock comprises a rising clock and a falling clock, and
   wherein the read/write command controller further comprises:
   a clock selector configured to select one of the rising clock and the falling clock in response to the write-read command.

7. The semiconductor integrated circuit of claim 1, wherein the first edge is a rising edge of the clock and the second edge is a falling edge of the clock.

8. The semiconductor integrated circuit of claim 3, wherein the column address latch unit is configured to latch and provide the external address as a column address in response to the read command, and latch and provide the write address provided from the shift register unit as the column address in response to the second write command.

* * * * *